(12) United States Patent
Chen

(10) Patent No.: US 8,492,216 B2
(45) Date of Patent: Jul. 23, 2013

(54) SEMICONDUCTOR STRUCTURE WITH CONTACT STRUCTURE AND MANUFACTURING METHOD OF THE SAME

(75) Inventor: Shih-Hung Chen, Jhudong Township, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 142 days.

(21) Appl. No.: 13/014,048

(22) Filed: Jan. 26, 2011

(65) Prior Publication Data

US 2012/0104542 A1    May 3, 2012

(30) Foreign Application Priority Data

Oct. 28, 2010 (TW) ............................... 99137030 A

(51) Int. Cl.
*H01L 21/336* (2006.01)
(52) U.S. Cl.
USPC ............ 438/197; 257/E21.165; 257/E21.175
(58) Field of Classification Search
USPC .................... 257/E21.165, E21.175; 438/197
See application file for complete search history.

(56) References Cited

U.S. PATENT DOCUMENTS 6,929,989 B2 * 8/2005 Yeh et al. ...................... 438/197
7,682,966 B1 * 3/2010 Rozbicki et al. .............. 438/637

OTHER PUBLICATIONS

Servalli, G.; "A 45nm Generation Phase Change Memory Technology;" IEEE; 2009; pp. 5.7.1-5.7.4.
Pellizzer, F., et al.; "A 90nm Phase Change Memory Technology for Stand-Alone Non-Volatile Memory Applications;" 2006 Symposium on VLSI Technology Digest of Technical Papers; IEEE; 2006; pp. 1-2.

* cited by examiner

*Primary Examiner* — Howard Weiss
*Assistant Examiner* — Steven Rao
(74) *Attorney, Agent, or Firm* — McClure, Qualey & Rodack, LLP

(57) ABSTRACT

The invention relates to a semiconductor structure and a manufacturing method of the same. The semiconductor structure includes a semiconductor substrate, an isolation layer, a first metal layer, and a second metal layer. The semiconductor substrate includes an upper substrate surface and a semiconductor device below the upper substrate surface. The isolation layer has opposite a first side wall and a second side wall. The first metal layer is disposed on the upper substrate surface. The first metal layer and the second metal layer are disposed on the first side wall and the second side wall, respectively. A lower surface of the second metal layer is below the upper substrate surface.

17 Claims, 9 Drawing Sheets

SEMICONDUCTOR STRUCTURE WITH CONTACT STRUCTURE AND MANUFACTURING METHOD OF THE SAME

This application claims the benefit of Taiwan application Serial No. 99137030, filed on Oct. 28, 2010, the subject matter of which is incorporated therein by reference.

BACKGROUND OF THE INVENTION

1. Field of the Invention

The invention relates in general to a semiconductor structure and a manufacturing method of the same, and more particularly to a semiconductor structure with a contact window and a manufacturing method of the same.

2. Description of the Related Art

With development of semiconductor circuits of large scale integration, very large scale integration and ultra large scale integration, the size of the semiconductor device, along with the area of the integrated circuit become smaller. The improvement of the device density brings many challenges.

With trend of scaling down, development of technology focus on using a shallow junction process for avoiding problems of breakdown and leakage mainly. Thus, a contact window is usually designed to have a uniform height and be not deeper than a semiconductor substrate. Therefore, a path length between the contact window and a semiconductor device, separated from the contact window by an isolation layer, is long. This long path would cause a voltage from the contact window a huge drop, resulting in RC delay and slow operation speed of the semiconductor device.

SUMMARY OF THE INVENTION

To resolve the above technical problems, the invention employs a semiconductor structure and a manufacturing method of the same. The semiconductor structure has a contact window formed by a metal having an extremely small resistance. The contact window is extended from in an isolation layer on a semiconductor substrate into below an upper substrate surface of the semiconductor substrate. Thus, a path length between contact window and the semiconductor device is small. Furthermore, a voltage drop between the contact window and the semiconductor device is small. Therefore, the RC delay is decreased. In addition, the operation speed is increased.

According to a first aspect of the present invention, a semiconductor structure is provided. The semiconductor structure includes a semiconductor substrate, an isolation layer, a first metal layer, and a second metal layer. The semiconductor substrate includes an upper substrate surface and a semiconductor device below the upper substrate surface. The isolation layer has opposite a first side wall and a second side wall. The first metal layer is disposed on the upper substrate surface. The first metal layer and the second metal layer are disposed on the first side wall and the second side wall, respectively. A lower surface of the second metal layer is below the upper substrate surface.

According to a second aspect of the present invention, a semiconductor structure is provided. The semiconductor structure includes a semiconductor substrate, an isolation layer, a first metal layer, and a second metal layer. The semiconductor substrate includes an upper substrate surface and a semiconductor device below the upper substrate surface. The isolation layer has opposite a first side wall and a second side wall. The first metal layer is disposed on the upper substrate surface. The first metal layer and the second metal layer are disposed on the first side wall and the second side wall, respectively. The second metal layer includes a first metal portion and a second metal portion on the first metal portion. The first metal portion has opposite a third side wall and a fourth side wall. The second metal portion has opposite a fifth side wall and a sixth side wall. A first distance between the third side wall and the fourth side wall is smaller than a second distance between the fifth side wall and the sixth side wall.

According to a third aspect of the present invention, a manufacturing method of a semiconductor structure is provided. The method includes following steps. A semiconductor substrate including an upper substrate surface is provided. A shallow trench isolation is formed in the semiconductor substrate. A semiconductor device is formed in the semiconductor substrate. The semiconductor device is below the upper substrate surface. An internal dielectric layer is formed on the shallow trench isolation. The shallow trench isolation and the internal dielectric layer form an isolation layer having opposite a first side wall and a second side wall. A first metal layer is formed on the upper substrate surface. A second metal layer is formed. The first metal layer and the second metal layer are disposed on the first side wall and the second side wall, respectively. A lower surface of the second metal layer is below the upper substrate surface.

The above and other aspects of the invention will become better understood with regard to the following detailed description of the preferred but non-limiting embodiment(s). The following description is made with reference to the accompanying drawings.

DETAILED DESCRIPTION OF THE INVENTION

First Embodiment

Figure 1:
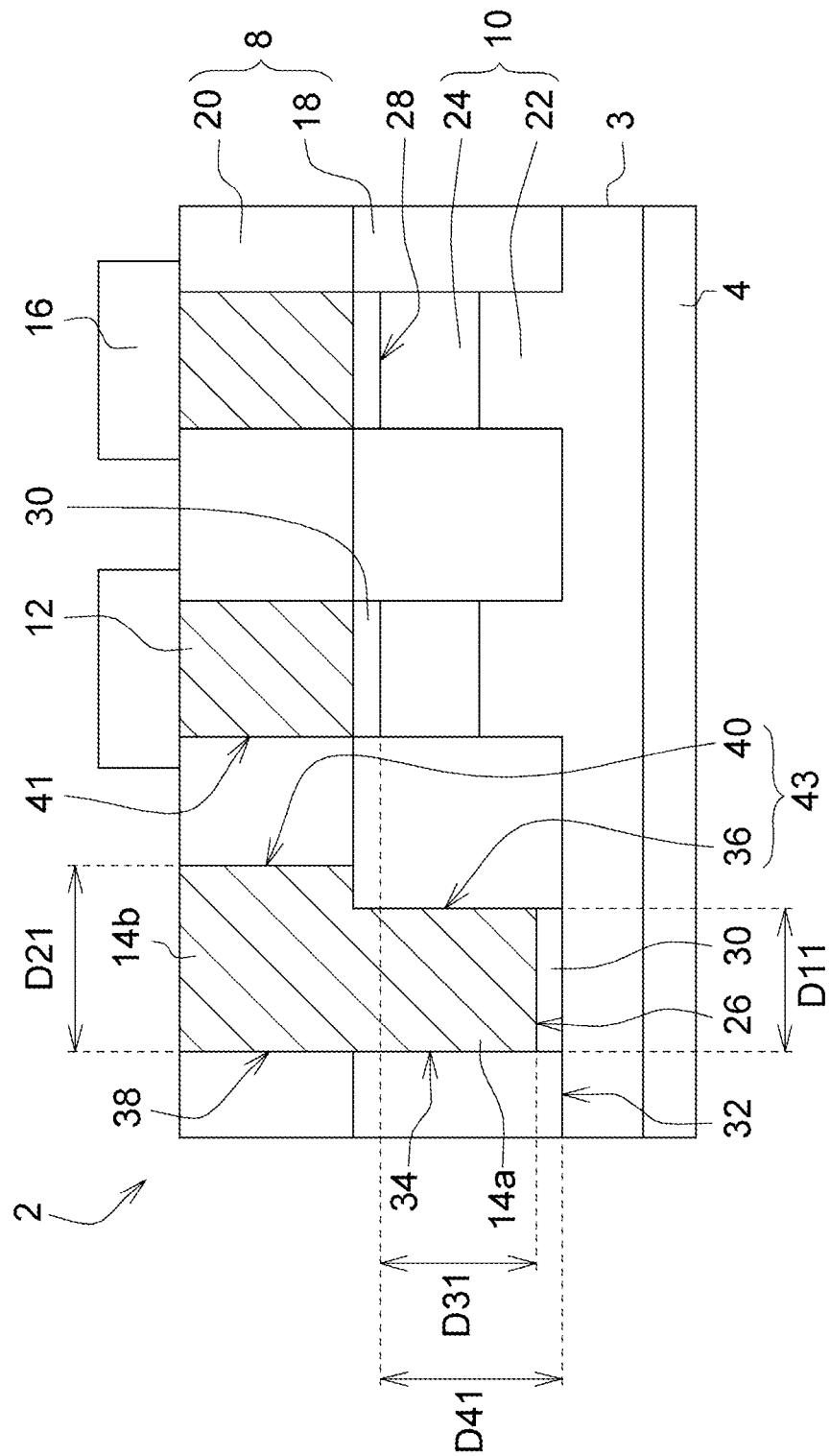
FIG. 1 illustrates a semiconductor structure of first embodiment of the present invention.

FIG. 1 illustrates a semiconductor structure of first embodiment of the present invention. Referring to FIG. 1, a semiconductor structure 2 comprises, for example, a semiconductor substrate 3, an isolation layer 8, a first metal layer 12, a second metal layer 14 and a semiconductor device 16. The semiconductor substrate 3 may comprise silicon, such as poly silicon. The semiconductor substrate 3 has an upper substrate surface 28. The semiconductor substrate 3 comprises, for example, a semiconductor layer 4 and a semiconductor device 10.

Referring to FIG. 1, the isolation layer 8 comprises, for example, a shallow trench isolation (STI) 18 and an internal dielectric layer 20. The shallow trench isolation 18 may be a dual STI. The isolation layer 8 has opposite a first side wall 41 and a second side wall 43. The first metal layer 12 and the second metal layer 14 are disposed on the first side wall 41 and the second side wall 43. For example, the second metal layer 14 comprises a first metal portion 14a and a second metal portion 14b disposed on the first metal portion 14a. The first metal layer 12 and the second metal layer 14 comprise tungsten, for example. The semiconductor structure 2 may further comprise a metal silicide layer 30 disposed between the semiconductor substrate 3 and the first metal layer 12, or disposed between the semiconductor substrate 3 and the second metal layer 14. In some embodiments, the metal silicide layer 30 may be omitted.

Referring to FIG. 1, in the second metal layer 14, a first distance D11 between opposite a third side wall 34 and a fourth side wall 36 of the first metal portion 14a may be smaller than a second distance D21 between opposite a fifth side wall 38 and a sixth side wall 40 of the second metal portion 14b. The third side wall 34 may be aligned with the fifth side wall 38 as shown in FIG. 1. A lower surface 26 of the second metal layer 14 may be below the upper substrate surface 28. In embodiments, a third distance D31 between the upper substrate surface 28 and the lower surface 26 of the second metal layer 14 may be larger than 1000 Å. A fourth distance D41 between the upper substrate surface 28 and a lower surface 32 of the shallow trench isolation 18 may be 500 Å~4000 Å. The third distance D31 minus the fourth distance D41 may equal to −1500 Å~3000 Å.

Referring to FIG. 1, in this embodiment, the semiconductor device 10 is a diode that may comprise a semiconductor portion 22a and a semiconductor portion 24 of different conductivity types. In one embodiment, for example, the semiconductor portion 22 has N type conductivity, the semiconductor portion 24 has P+ type conductivity, and the semiconductor layer 4 has P− type conductivity. The semiconductor device 16 may comprise a memory such as PCM, RRAM, NVM, etc. The lower surface 26 of the second metal layer 14 having an extremely small resistance is below the upper substrate surface 28. In other words, the second metal layer 14 and the semiconductor device 10 are close thus resistance between the second metal layer 14 and the semiconductor device 10 are small. Therefore, an external voltage applied to through the second metal layer 14 can be transferred to the semiconductor device 10, such as a diode, to drive the semiconductor device 16. In addition, operation speed is increased.

Figure 2:
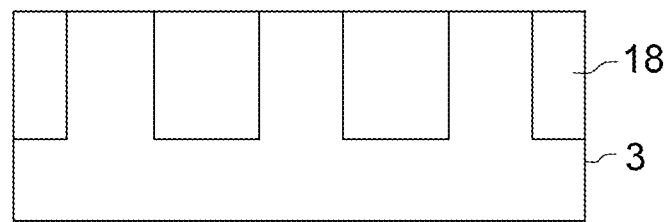
FIGS. 2-8 illustrate a manufacturing process of the semiconductor structure of first embodiment.
Figure 3:
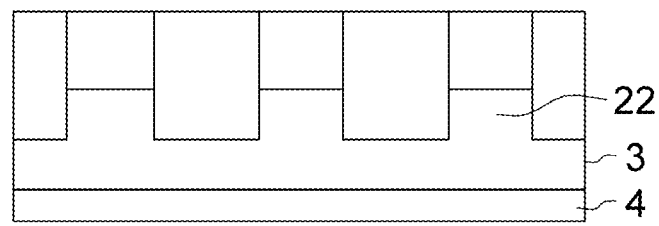
Figure 4:
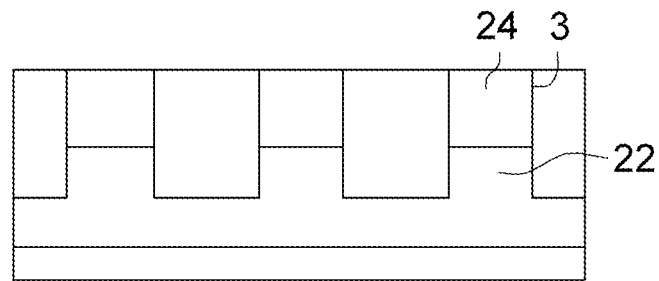
Figure 5:
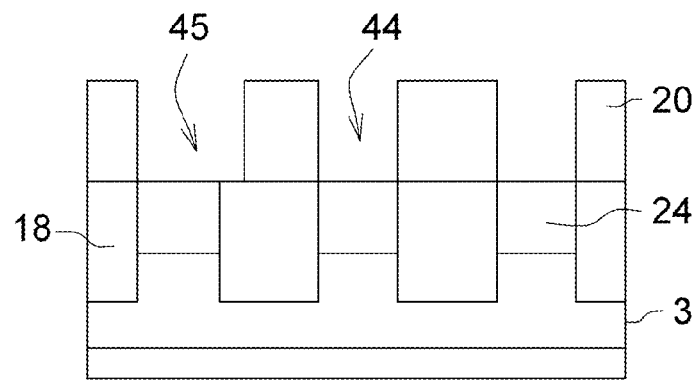

FIGS. 2-8 illustrate a manufacturing process of the semiconductor structure 2 as shown in FIG. 1. Referring to FIG. 2, the shallow trench isolation 18 is formed on the semiconductor substrate 3. Referring to FIG. 3, the semiconductor layer 4 and the semiconductor portion 22 are formed in the semiconductor substrate 3 by an ion implantation method. Referring to FIG. 4, the semiconductor portion 24 is formed in the semiconductor substrate 3 on the semiconductor portion 22 by an ion implantation method. Referring to FIG. 5, the internal dielectric layer 20 is formed on the shallow trench isolation 18. In addition, an opening 44 and an opening 45 are formed in the internal dielectric layer 20.

Figure 6:
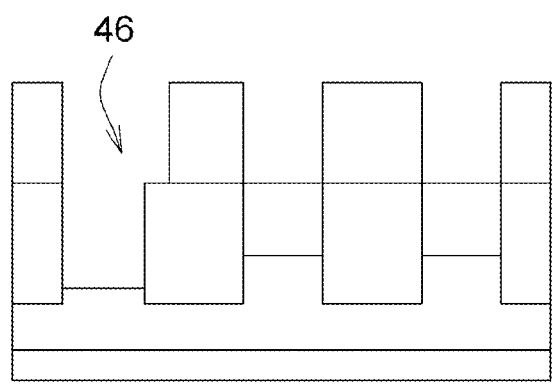
Figure 7:
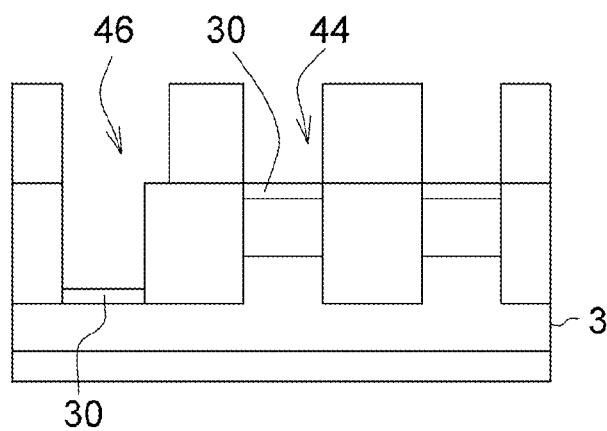
Figure 8:
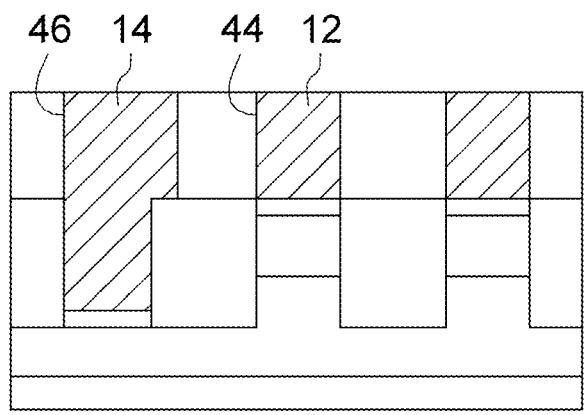

Next, an opening 46 as shown in FIG. 6 is formed by removing the semiconductor portion 24 and the semiconductor portion 22 exposed by the opening 45. Referring to FIG. 7, the metal silicide layer 30 is formed on the surface of the semiconductor substrate 3 exposed by the opening 44 and the opening 46 by a self-aligned metal silicide method. In some embodiments, the metal silicide layer 30 is omitted. Referring to FIG. 8, next, the first metal layer 12 is formed in the opening 44, and the second metal layer 14 is formed in the opening 46. Next, the semiconductor device 16 is formed on the first metal layer 12. Thus, the semiconductor structure 2 as shown in FIG. 1 is completed.

Second Embodiment

Figure 9:
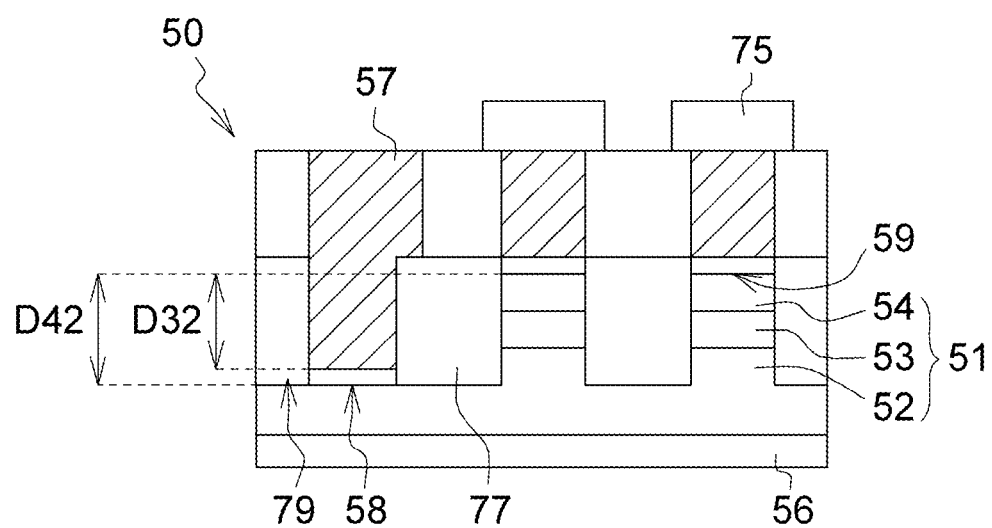
FIG. 9 illustrates a semiconductor structure of second embodiment of the present invention.

FIG. 9 illustrates a semiconductor structure of second embodiment of the present invention. The semiconductor structure 50 of FIG. 9 differs with the semiconductor structure 2 of FIG. 1 in that the semiconductor device 51 is a bipolar junction transistor, and may comprise a semiconductor portion 52, a semiconductor portion 53 and a semiconductor portion 54. In one embodiment, for example, the semiconductor portion 52 and the semiconductor portion 54 have N type conductivity, the semiconductor portion 53 has P+ type conductivity, and the semiconductor layer 56 has P− type conductivity.

Referring to FIG. 9, the lower surface 58 of the second metal layer 57 having an extremely small resistance is below the upper substrate surface 59. In other words, the second metal layer 57 and the semiconductor device 51 are close and thus resistance, i.e. voltage drop, between the second metal layer 57 and the semiconductor device 51 is small. Therefore, an external voltage applied to through the second metal layer 57 can be effectively transferred to the semiconductor device 51, such as a bipolar junction transistor, to drive the semiconductor device 75. In addition, operation speed is increased.

In embodiments, the third distance D32 between the upper substrate surface 59 and the lower surface 58 of the second metal layer 57 may be larger than 1000 Å. The fourth distance D42 between the upper substrate surface 59 and the lower surface 79 of the shallow trench isolation 77 may be 500 Å~4000 Å. The third distance D32 minus the fourth distance D42 may equal to −1500 Å~3000 Å.

Third Embodiment

Figure 10:
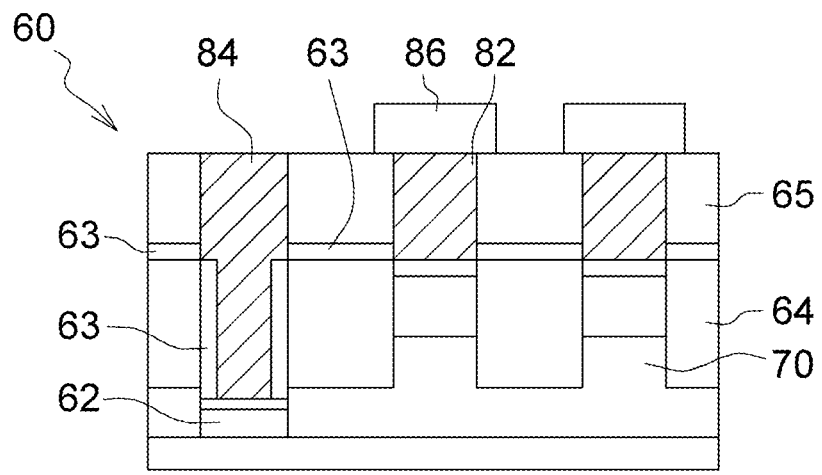
FIG. 10 illustrates a semiconductor structure of third embodiment of the present invention.

FIG. 10 illustrates a semiconductor structure of third embodiment of the present invention. The semiconductor structure 60 of FIG. 10 differs with the semiconductor structure 2 of FIG. 1 in that the semiconductor structure 60 has a semiconductor portion 62 below the second metal layer 84. In one embodiment, for example, the semiconductor portion 62 and the semiconductor portion 70 have N type conductivity. A dopant concentration (N+) of the semiconductor portion 62 is larger than a dopant concentration (N) of the semiconductor portion 70. In addition, the semiconductor structure 60 also comprises an etching stop layer 63 disposed between the shallow trench isolation 64 and the internal dielectric layer 65. The etching stop layer 63 may comprise silicon nitride or silicon oxynitride.

Figure 11:
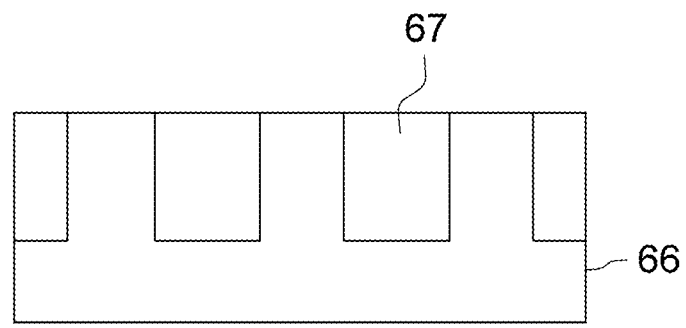
FIGS. 11-18 illustrate a manufacturing process of the semiconductor structure of third embodiment.
Figure 12:
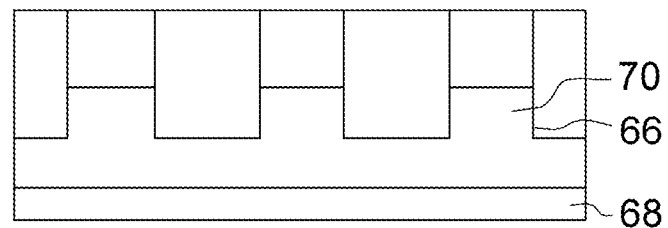
Figure 13:
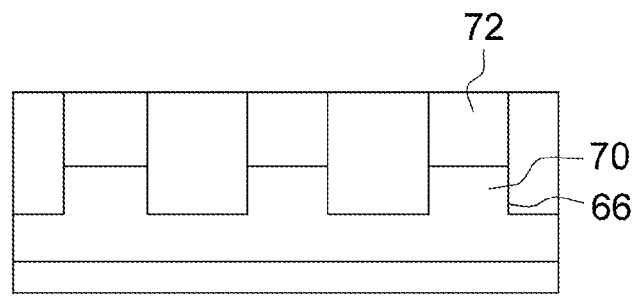
Figure 14:
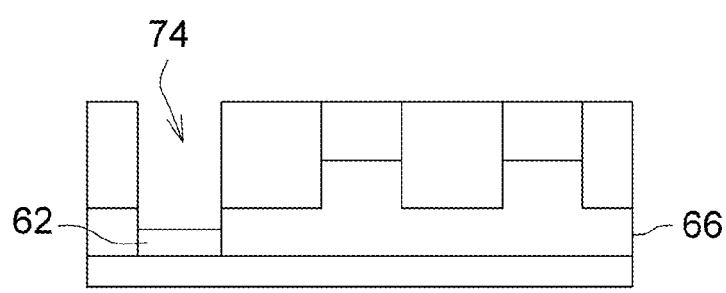
Figure 15:
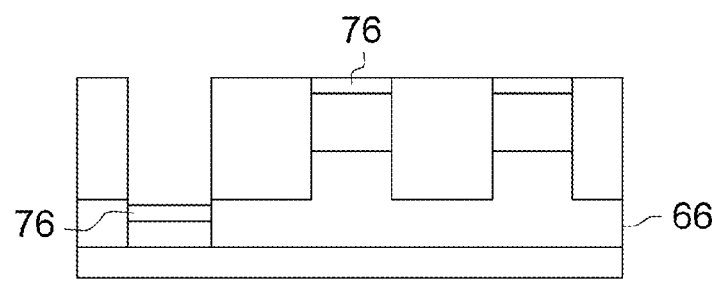

FIGS. 11-18 illustrate a manufacturing process of the semiconductor structure 60 of third embodiment as shown in FIG. 10. Referring to FIG. 11, the shallow trench isolation 67 is formed on the semiconductor substrate 66. Referring to FIG. 12, the semiconductor layer 68 and the semiconductor portion 70 are formed in the semiconductor substrate 66 by an ion implantation method. Referring to FIG. 13, the semiconductor portion 72 is formed in the semiconductor substrate 66 on the semiconductor portion 70 by an ion implantation method. Referring to FIG. 14, an opening 74 is formed by removing a part of the semiconductor substrate 66. In addition, the semiconductor portion 62 is formed in the semiconductor substrate 66 exposed by the opening 74 by an ion implantation method. Referring to FIG. 15, the metal silicide layer 76 is formed on an exposed surface of the semiconductor substrate

Figure 16:
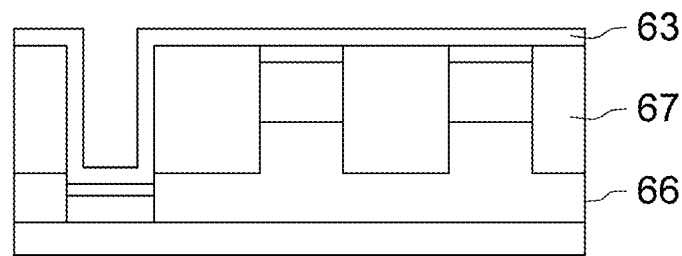
Figure 17:
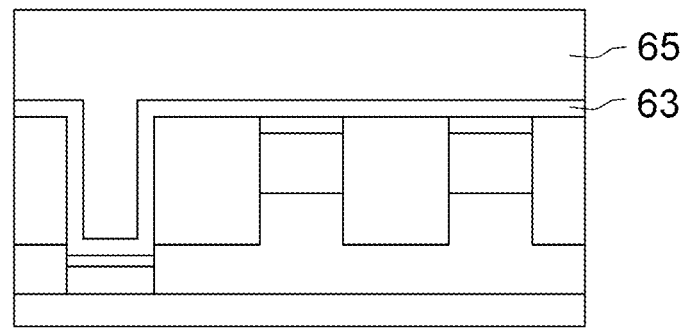

66. Referring to FIG. 16, the etching stop layer 63 is formed on the semiconductor substrate 66 and the shallow trench isolation 67. Referring to FIG. 17, the internal dielectric layer 65 is formed on the etching stop layer 63.

Figure 18:
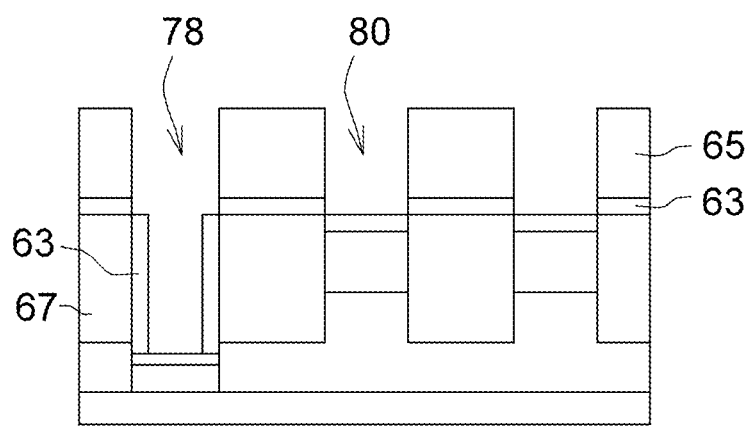

Referring to FIG. 18, an opening 78 and an opening 80 are formed by removing a part of the internal dielectric layer 65. Next, the etching stop layer 63 exposed by the opening 78 and the opening 80 is removed. In the step of removing the internal dielectric layer 65, the etching stop layer 63 could prevent an underlying material from damage. In embodiments, the etching stop layer 63 is removed by an anisotropic etching method in which the etching stop layer 63 has a vertical etching rate faster than a horizontal etching rate. Therefore, after the etching step, in the opening 78 the etching stop layer 63 on the side wall of the shallow trench isolation 67 could be remained. Next, the first metal layer 82 and the second metal layer 84 are formed in the opening 80 and the opening 78, respectively. Moreover, the semiconductor device 86 is formed on the first metal layer 82. Thus, the semiconductor structure 60 as shown in FIG. 10 is completed.

Fourth Embodiment

Figure 19:
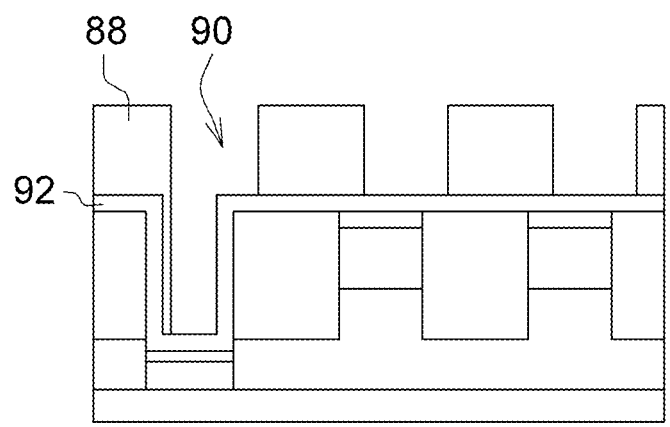
FIG. 19 illustrates a step of a manufacturing process of a semiconductor structure of fourth embodiment.
Figure 20:
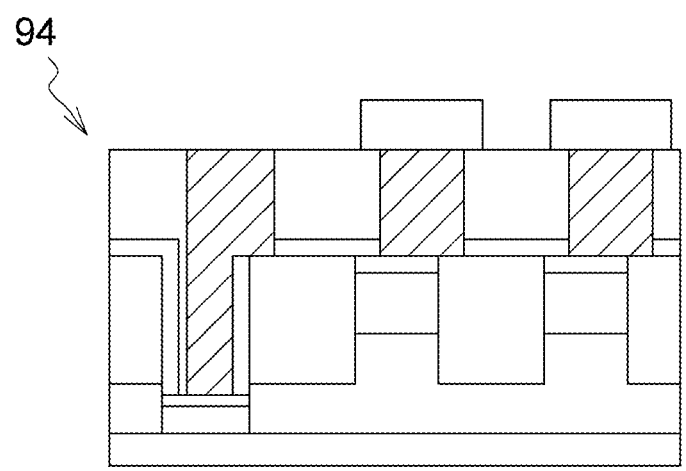
FIG. 20 illustrates the semiconductor structure of fourth embodiment of the present invention.

The manufacturing method of forth embodiment differs with manufacturing method of third embodiment in that the semiconductor structure has the etching stop layer. Thus, a great shift of the step of forming the opening in the internal dielectric layer could be tolerated. In addition, damage that would affect the product would not be generated. Referring to FIG. 19, in some embodiments, for example, the position of the opening 90 is shifted due to a shift of the etching process for removing the internal dielectric layer 88. The etching stop layer 92 could prevent an underlying material from damage resulted form the etching. Therefore, the semiconductor structure 94 as shown in FIG. 20 is completed.

Fifth Embodiment

Figure 21:
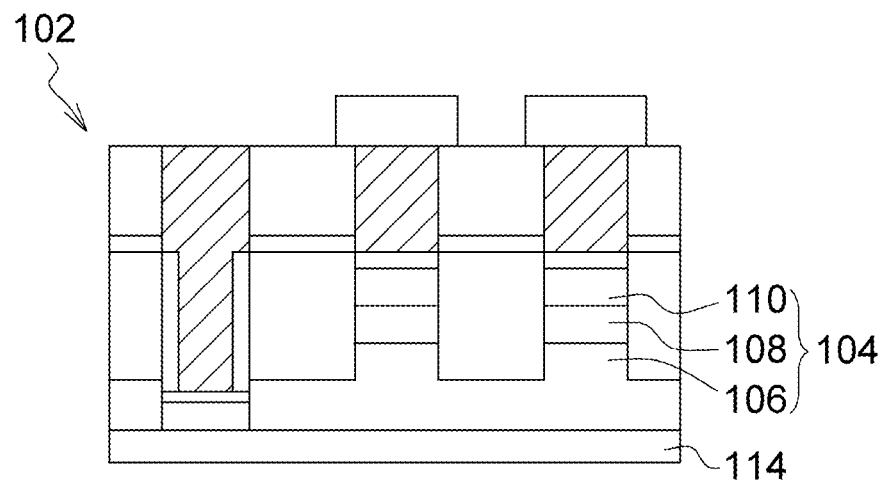
FIG. 21 illustrates a semiconductor structure of fifth embodiment of the present invention.

FIG. 21 illustrates a semiconductor structure of fifth embodiment of the present invention. The semiconductor structure 102 of FIG. 21 differs with the semiconductor structure 60 of FIG. 10 in that the semiconductor device 104 is a bipolar junction transistor, and may comprise the semiconductor portion 106, the semiconductor portion 108 and the semiconductor portion 110. In one embodiment, for example, the semiconductor portion 106 and the semiconductor portion 110 have N type conductivity, the semiconductor portion 108 has P+ type conductivity, and the semiconductor layer 114 has P− type conductivity.

Sixth Embodiment

Figure 22:
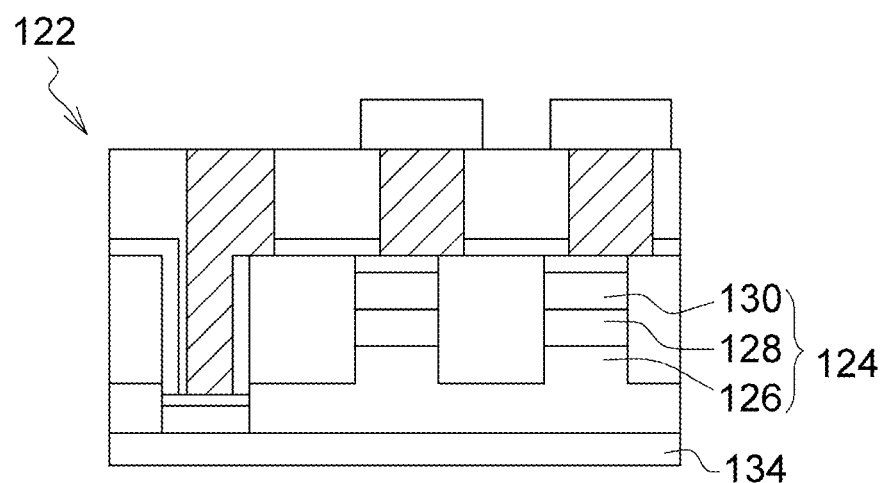
FIG. 22 illustrates a semiconductor structure of sixth embodiment of the present invention.

FIG. 22 illustrates a semiconductor structure of sixth embodiment of the present invention. The semiconductor structure 122 of FIG. 22 differs with the semiconductor structure 94 of FIG. 20 in that the semiconductor device 124 is a bipolar junction transistor, and may comprise the semiconductor portion 126, the semiconductor portion 128 and the semiconductor portion 130. In one embodiment, for example, the semiconductor portion 126 and the semiconductor portion 130 have N type conductivity, the semiconductor portion 128 has P+ type conductivity, and the semiconductor layer 134 has P− type conductivity.

The semiconductor device can be properly adjusted according to condition. For example, the diode may be a PN or NP diode. The bipolar junction transistor may be a PNP or NPN bipolar junction transistor. The second metal layer can also be applied with a TFT.

In embodiments of the present invention, the contact window is formed by the second metal layer having an extremely small resistance. The lower surface of the second metal layer is below the upper substrate surface of the semiconductor substrate. Thus, a voltage drop between the second metal layer and the semiconductor device is small. Therefore, an external voltage applied to through the second metal layer can be transferred to the diode or bipolar junction transistor to drive the memory. In addition, operation speed is increased. During manufacturing the semiconductor structure, the etching stop layer can be formed before forming the internal dielectric layer. The etching stop layer can prevent the underlying material from damage. Thus, a great shift of the step of forming the opening in the internal dielectric layer could be tolerated. In addition, damage that would affect the product would not be generated.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a semiconductor substrate comprising an upper substrate surface and a semiconductor device below the upper substrate surface;
    an isolation layer having opposite a first side wall and a second side wall;
    a first metal layer disposed on and electrically connected to the upper substrate surface; and
    a second metal layer, the first metal layer and the second metal layer being disposed on the first side wall and the second side wall, respectively, a lower surface of the second metal layer being below the upper substrate surface, the first metal layer and the second metal layer being separated from each other by the isolation layer.

2. The semiconductor structure according to claim 1, wherein the second metal layer comprises a first metal portion and a second metal portion on the first metal portion, the first metal portion has opposite a third side wall and a fourth side wall, the second metal portion has opposite a fifth side wall and a sixth side wall, a first distance between the third side wall and the fourth side wall is smaller than a second distance between the fifth side wall ant the sixth side wall.

3. The semiconductor structure according to claim 1, wherein the first side wall is aligned with the third side wall.

4. The semiconductor structure according to claim 1, wherein the semiconductor device comprises a diode or a bipolar junction transistor.

5. The semiconductor structure according to claim 1, wherein the isolation layer comprises a shallow trench isolation and an internal dielectric layer disposed on the shallow trench isolation, a third distance between the upper substrate surface and the lower surface of the second metal layer is larger than 1000 Å, a fourth distance between the upper substrate surface and a lower surface of the shallow trench isolation is 500 Å~4000 Å, the third distance minus the fourth distance equals −1500 Å~3000 Å.

6. The semiconductor structure according to claim 1, further comprising a metal silicide layer disposed between the semiconductor substrate and the first metal layer, or disposed between the semiconductor substrate and the second metal layer.

7. The semiconductor structure according to claim 1, wherein the isolation layer comprises a shallow trench isolation and an internal dielectric layer, the semiconductor structure further comprises an etching stop layer disposed between the shallow trench isolation and the internal dielectric layer.

8. A manufacturing method of a semiconductor structure, comprising:
   providing a semiconductor substrate comprising an upper substrate surface;
   forming a shallow trench isolation in the semiconductor substrate;
   forming a semiconductor device in the semiconductor substrate, the semiconductor device being below the upper substrate surface;
   forming an internal dielectric layer on the shallow trench isolation, the shallow trench isolation and the internal dielectric layer forming an isolation layer having opposite a first side wall and a second side wall;
   forming a first metal layer on and electrically connected to the upper substrate surface; and
   forming a second metal layer, the first metal layer and the second metal layer being disposed on the first side wall and the second side wall, respectively, a lower surface of the second metal layer being below the upper substrate surface.

9. The manufacturing method of the semiconductor structure according to claim 8, wherein the second metal layer comprises a first metal portion and a second metal portion on the first metal portion, the first metal portion has opposite a third side wall and a fourth side wall, the second metal portion has opposite a fifth side wall and a sixth side wall, a first distance between the third side wall and the fourth side wall being smaller than a second distance between the fifth side wall and the sixth side wall.

10. The manufacturing method of the semiconductor structure according to claim 8, wherein the third side wall is aligned with the fifth side wall.

11. The manufacturing method of the semiconductor structure according to claim 8, wherein the semiconductor device comprises a diode or a bipolar junction transistor.

12. The manufacturing method of the semiconductor structure according to claim 8, wherein a third distance between the upper substrate surface and the lower surface of the second metal layer is larger then 1000 Å, a fourth distance between the upper substrate surface and a lower surface of the shallow trench isolation is 500 Å~4000 Å, the third distance minus the fourth distance equals −1500 Å~3000 Å.

13. The manufacturing method of the semiconductor structure according to claim 8, further comprising:
   before forming the internal dielectric layer on the shallow trench isolation, forming an etching stop layer on the semiconductor substrate and the shallow trench isolation;
   after forming the internal dielectric layer on the shallow trench isolation, removing a part of the internal dielectric layer to forming a opening in the internal dielectric layer; and
   removing the etching stop layer exposed by the opening.

14. The manufacturing method of the semiconductor structure according to claim 8, further comprising:
   forming a metal silicide layer on the semiconductor substrate.

15. The semiconductor structure according to claim 1, wherein the semiconductor device comprises a first semiconductor portion and a second semiconductor portion both below the upper substrate surface of the semiconductor substrate, the first semiconductor portion and the second semiconductor portion have a PN junction interface therebetween.

16. The semiconductor structure according to claim 15, wherein the first metal layer is electrically connected to the first semiconductor portion of the semiconductor device through a lower surface of the first semiconductor portion, the second metal layer is electrically connected to the second semiconductor portion of the semiconductor device through the lower surface of the second semiconductor portion.

17. The semiconductor structure according to claim 15, wherein the PN junction interface of the first semiconductor portion and the second semiconductor portion of the semiconductor device is below the upper substrate surface of the semiconductor substrate.

* * * * *